(12) United States Patent
Sho et al.

(10) Patent No.: US 8,084,192 B2
(45) Date of Patent: Dec. 27, 2011

(54) METHOD FOR FORMING RESIST PATTERN

(75) Inventors: Kotaro Sho, Kanagawa-ken (JP);
Yoshihiro Naka, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 561 days.

(21) Appl. No.: 12/260,659

(22) Filed: Oct. 29, 2008

(65) Prior Publication Data

US 2009/0253082 A1     Oct. 8, 2009

(30) Foreign Application Priority Data

Oct. 30, 2007  (JP) ................................ 2007-282375

(51) Int. Cl.
*G03F 7/26* (2006.01)
(52) U.S. Cl. ........................................ 430/322; 430/311
(58) Field of Classification Search .................. 430/312, 430/330, 322, 311, 270.1
See application file for complete search history.

(56) References Cited

U.S. PATENT DOCUMENTS

| | | | |
|---|---|---|---|
| 5,939,236 A | 8/1999 | Pavelchek et al. | |
| 2006/0014106 A1* | 1/2006 | Hatakeyama et al. | ........ 430/311 |

FOREIGN PATENT DOCUMENTS

| | | |
|---|---|---|
| JP | 2004-199084 | 7/2004 |
| JP | 2005-10633 | 1/2005 |
| JP | 2006-53543 | 2/2006 |
| JP | 2007-17949 | 1/2007 |
| JP | 2007-171895 | 7/2007 |
| JP | 2008-39815 | 2/2008 |

OTHER PUBLICATIONS

Ohiwa, "Reactive Ion Etching", Microfabrication Technique of Next Generation, Toshiba Review, vol. 59, No. 8, pp. 22-25, (2004).
Notification of Reason(s) for Refusal issued by the Japanese Patent Office on Sep. 27, 2011, for Japanese Patent Application No. 2007-282375, and English-language translation thereof.

* cited by examiner

*Primary Examiner* — Kathleen Duda
*Assistant Examiner* — Caleen Sullivan
(74) *Attorney, Agent, or Firm* — Finnegan, Henderson, Farabow, Garrett & Dunner, L.L.P.

(57) ABSTRACT

A method for forming a resist pattern, includes forming a lower layer film, forming an intermediate film on the lower layer film, forming a photoresist film containing a photoacid-generating agent on the intermediate film, exposing the photoresist film, and developing the photoresist film. The lower layer film contains at least any one of a free acid, a thermoacid-generating agent, and a photoacid-generating agent, on a substrate to be treated.

8 Claims, 10 Drawing Sheets

METHOD FOR FORMING RESIST PATTERN

CROSS-REFERENCE TO RELATED APPLICATIONS

This application is based upon and claims the benefit of priority from the prior Japanese Patent Application No.2007-282375, filed on Oct. 30, 2007; the entire contents of which are incorporated herein by reference.

BACKGROUND OF THE INVENTION

1. Field of the Invention

This invention relates to a method for forming a resist pattern which is used in production of semiconductor devices and in which a photoresist containing a photoacid-generating acid is used.

2. Background Art

The method for producing a semiconductor device generally includes many steps for forming a desired pattern on a silicon wafer or a substrate to be treated in which a substance is stacked thereon as a film to be processed. In patterning of the substrate to be treated, first, a photoresist (photosensitive substance) containing a photoacid-generating agent is applied onto the substrate to be treated to form a photoresist film, and a predetermined region of the resist film is subjected to exposure. Next, exposed part of the photoresist film or non-exposed part thereof is removed by development treatment to form a resist pattern, and the substrate to be treated is etched so that the resist pattern serves as an etching mask.

Furthermore, there has been developed a multilayer resist process technique in which a lower layer film, an intermediate film, and an upper layer film (photoresist film) are formed on the substrate to be treated and the substrate to be treated is etched (see, for example, "Microfabrication Technique of Next Generation", Toshiba Review, Vol. 59, No. 8 (2004), p 22-p 25 authored by Tokuhisa Oiwa).

As an exposure light source, an ultraviolet light such as KrF excimer laser or ArF excimer laser is used. However, as LSI is finer, required resolution has become less than the wavelength of the ultraviolet light, and the current condition is that exposure process capacity such as exposure amount capacity and focus capacity has been shorter.

As the semiconductor device is finer, dependency on the substrate to be treated of a profile of the resist pattern is larger, and this has become an obstacle of the device production or the further finer device. As one of causes of dependency on the substrate to be treated of a profile of the resist pattern, diffusion of chemical substance contained in the substrate to be treated into the resist can be thought. For the measures thereof, it can be thought to perform a resist design that a protective group with small detachment energy having little influence on the diffusion of chemical substance contained in the substrate to be treated into the resist is taken in a resist base resin. However, this method is in danger of inducing degradation of lithography performance of the resist and becoming an obstacle of production of the semiconductor device.

SUMMARY OF THE INVENTION

According to an aspect of the invention, there is provided, a method for forming a resist pattern, including: forming a lower layer film containing at least any one of a free acid, a thermoacid-generating agent, and a photoacid-generating agent, on a substrate to be treated; forming an intermediate film on the lower layer film; forming a photoresist film containing a photoacid-generating agent on the intermediate film; a step of exposing the photoresist film; and a step of developing the photoresist film.

According to another aspect of the invention, there is provided a method for forming a resist pattern, including: forming a buffering-agent-containing film containing an acid and a salt of the acid on a substrate to be treated; forming a photoresist film containing a photoacid-generating agent on the buffering-agent-containing film; exposing the photoresist film; and developing the photoresist film.

BRIEF DESCRIPTION OF THE DRAWINGS

FIGS. 7A1 to 7B2 are diagrams showing sectional SEM photographs of resist pattern according to the specific example of the second embodiment of the invention with sectional SEM photographs of the comparative example;

DETAILED DESCRIPTION OF THE INVENTION

Hereinafter, embodiments of the invention will be explained with reference to drawings.

First Embodiment

A substrate to be treated occasionally includes various acids or bases, and in a process in which a photoresist containing photoacid-generating agent is directly applied to such a substrate to be treated and then a resist pattern is obtained through post-application bake•exposure•post-exposure bake•development•rinse•dry, the acid•base or both thereof diffuse(s) from the substrate to be treated into the resist in the exposure and the post-exposure bake, and inactivation or increase of activity of acid generated by the photoacid-generating agent in the resist is caused, and skirt shape or constriction shape of the resist profile is caused. From such a reason, the dependency of the substrate to be treated is caused. In particular, this is significant in the chemical-amplification-type photoresist because of sensitivity to acid.

By contrast, in a following first embodiment of the invention, a buffering-agent-containing film containing an acid and a salt of the acid is provided on the substrate to be treated, and a photoresist film is formed on the buffering-agent-containing film. Further specifically, a resin solution containing an organic acid and the organic salt as the buffer agent is applied thereto and the post-application bake is performed, and thereby, the buffering-agent-containing film insolubilized to a resist solution is provided, and the photoresist film is formed thereon.

By the buffering-agent-containing film, acid or base diffusing from the substrate to be treated in the exposure or the post-exposure bake is trapped and the acid or the base is prevented from diffusing into the resist, and thereby, a resist pattern profile having low dependency on the substrate to be treated is obtained.

FIGS. 1A-1D are sectional views for explaining a first specific example of the method for forming a resist pattern according to the first embodiment of the invention. In the drawings after FIG. 1, the same signs are appended to the same components as explained with respect to a previous drawing, and detailed explanation thereof will be omitted.

Figure 1A:
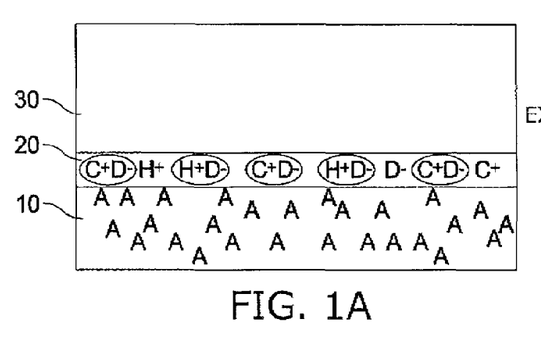
FIGS. 1A to 1D are sectional views for explaining a first specific example of a method for forming a resist pattern according to a first embodiment of the invention.

First, as shown in FIG. 1A, a buffering-agent-containing film 20 containing an acid and a salt thereof is formed on a film to be processed 10. The film to be processed 10 is a film to be processed containing an acid, and specifically includes SOG (Spin-On-Glass) to which an acid is added. Moreover, "A" in the film to be processed represents the acid. The film to be processed 10 is formed on a substrate, which is not shown, but the substrate and the film to be process are set to be the substrate to be treated.

Here, as the buffering-agent-containing film 20, the buffering-agent-containing film containing an organic acid and a salt of the organic acid is used. The buffering-agent-containing film containing an organic acid and a salt of the organic acid as a buffering agent is applied onto a substrate to be treated and the post-application bake is performed, and thereby, the buffering-agent-containing film 20 insolubilized to the resist solution is formed. The film thickness of the buffering-agent-containing film 20 is set to, for example, 100 nm or less.

As the organic acid, the organic acid having an aromatic ring structure or a hetero aromatic ring structure can be used. The organic acid having an aromatic ring structure includes sulfonic acid, and the organic acid having a hetero aromatic ring structure includes succinic acid.

In the buffering-agent-containing film 20, $H^+D^-$ represents the organic acid, and $C^+D^-$ represents the organic salt thereof, and $H^+$ represents dissociating acid, and $D^-$ represents dissociating base. In the buffering-agent-containing film 20, the ratio of $H^+D^-$, $C^+D^-$, $H^+$, and $D^-$ is determined by a predetermined equilibrium constant.

Furthermore, a chemical-amplification-type photoresist is applied onto the buffering-agent-containing film 20, the post-application bake is performed to form a photoresist film 30 containing photoacid-generating agent 30 containing a photoacid-generating agent. The buffering-agent-containing film 20 and the photoresist film 30 may be contacted, but another film may lie between the buffering-agent-containing film 20 and the photoresist film 30.

Figure 1B:
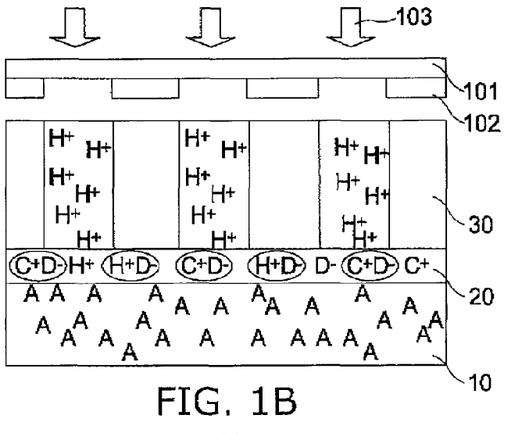

Next, as shown in FIG. 1B, the photoresist film 30 is exposed to an exposure light 103 such as KrF excimer laser through an exposure mask in which a transmissive part 101 is provided with a light-shielding part 102. The $H^+$ in the photoresist film 30 represents the acid generated in a photosensing photoacid-generating agent.

Figure 1C:
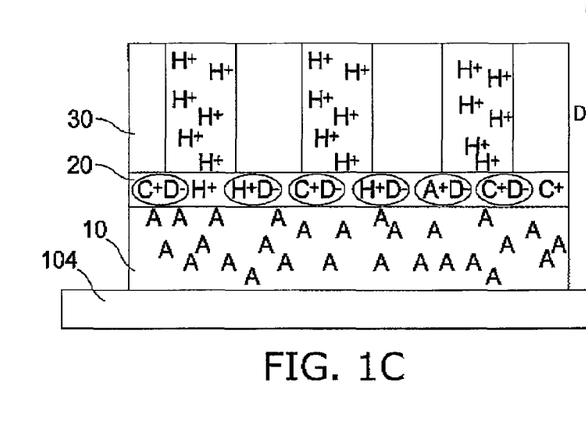

Next, as shown in FIG. 1C, an exposed substrate to be treated (resist) is subjected to post-exposure bake (PEB) by a baker 104.

Figure 1D:
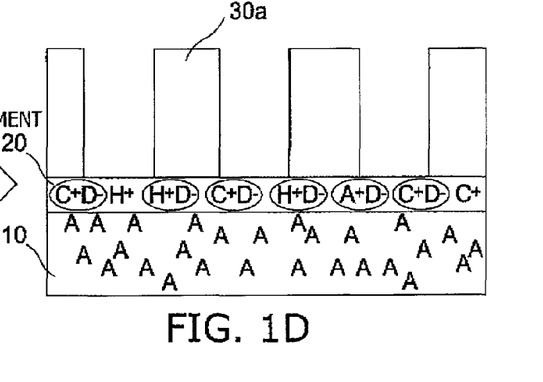

Next, as shown in FIG. 1D, the resist subjected to the post-exposure bake is developed and furthermore rinsed and dried to form a resist pattern 30a.

On the other hand, FIG. 2 is a sectional view showing a comparative example (first comparative example) to the first specific example of the method for forming a resist pattern according to the first embodiment of this invention.

Figure 2A:
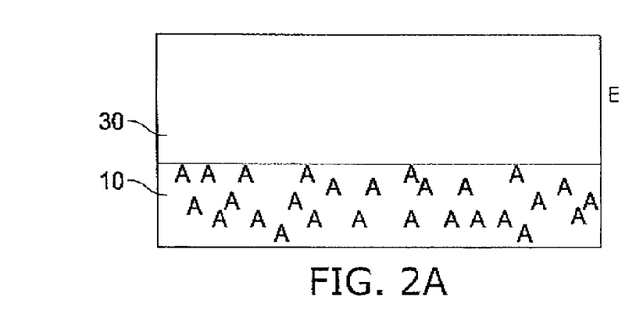
FIGS. 2A to 2D are sectional views showing a comparative example (first comparative example) to the first specific example of the method for forming a resist pattern according to the first embodiment of the invention.
Figure 2B:
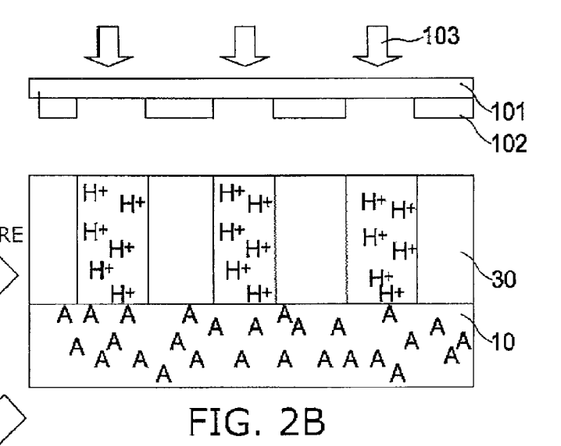
Figure 2C:
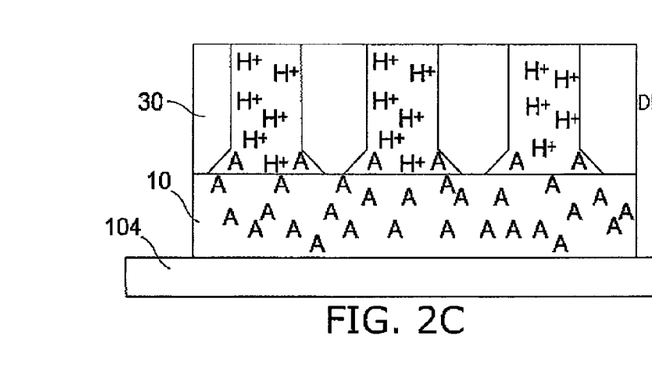
Figure 2D:
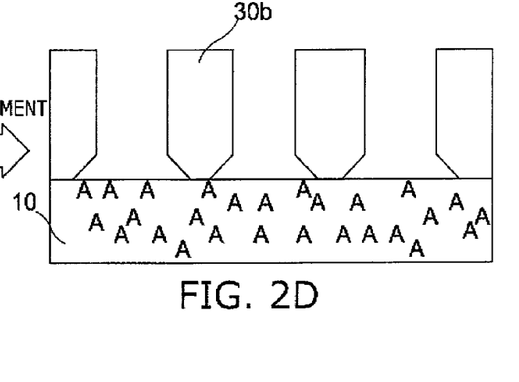

In this first comparative example, the chemical-amplification-type resist is directly applied onto the film to be processed 10 containing the acid and the post-application bake is performed to form the photoresist film 30 (FIG. 2A), and then in the same method as the first specific example, the exposure (FIG. 2B) and the post-exposure bake (FIG. 2C) are performed, and furthermore, development, rinse, and dry are performed to form a resist pattern 30b (FIG. 2D).

In the first comparative example shown in FIG. 2, the acid "A" in the film to be processed 10 diffuses into the photoresist in the post-exposure bake (PEB) (FIG. 2C), and increase of activity of the acid $H^+$ generated by the photoacid-generating-agent in the photoresist is caused, and therefore, the obtained resist pattern 30b has a shape with constriction generated in the root thereof (FIG. 2D).

By contrast, in the first specific example of this embodiment shown in FIG. 1, by the post-exposure bake (PEB), the acid "A" in the film to be processed 10 diffuses into the buffering-agent-containing film 20, but binds to the base $D^-$ contained in the buffering-agent-containing film 20 to be $A^+D^-$ and is trapped in the buffering-agent-containing film 20, and therefore, does not diffuse into the photoresist (FIG. 1C). That is, by providing the buffering-agent-containing film 20, the acid $H^+$ released from the film to be processed 10 can be prevented from invading the photoresist film 30.

Therefore, the increase of activity of the acid $H^+$ generated by the photoacid-generating agent in the photoresist is not caused, and about perpendicular resist pattern 30a having no constriction can be obtained (FIG. 1D).

FIG. 3 is a sectional view for explaining a second specific example of the method for forming a resist pattern according to the first embodiment of this invention.

Figure 3A:
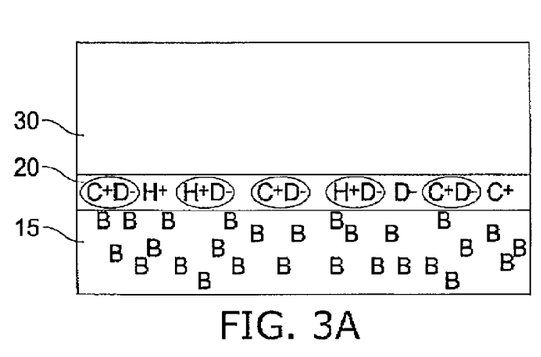
FIGS. 3A to 3D are sectional views for explaining a second specific example of the method for forming a resist pattern according to the first embodiment of the invention.

First, as shown in FIG. 3A, on a film to be processed 15, the same buffering-agent-containing film 20 as the first specific example is formed in the same procedure as the first specific example. The film to be processed 15 is a film to be process containing base, and specifically includes a TEOS (Tetraethyl orthosilicate, Tetraethoxysilane) film or a silicon nitride film. Moreover, "B" in the film to be processed 15 represents base. The film to be processed 15 is formed on a substrate, which is not shown, but the substrate and the film to be processed are Included to be the substrate to be treated.

Furthermore, in the same manner as the first specific example, the chemical-amplification-type photoresist is applied onto the buffering-agent-containing film 20 and the post-application bake is performed to form the photoresist film 30. Also, here, the buffering-agent-containing film 20 and the photoresist film 30 may be contacted, but another film may lie between the buffering-agent-containing film 20 and the photoresist film 30.

Figure 3B:
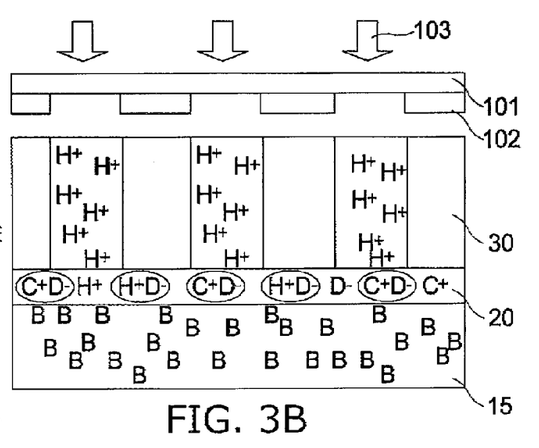
Figure 3C:
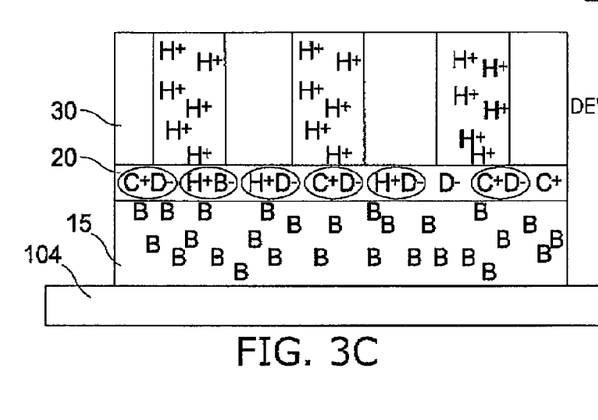
Figure 3D:
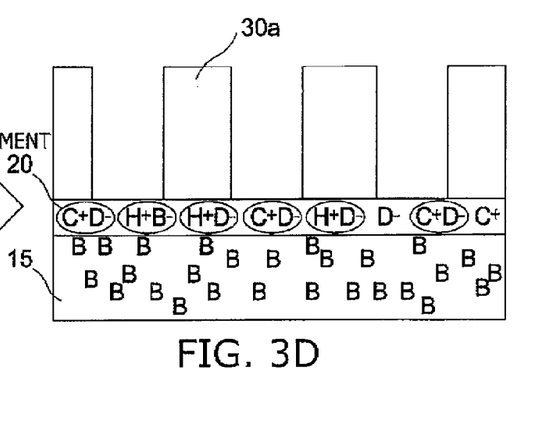

Hereinafter, in the same method as the first specific example (FIGS. 1B-1D), as shown in FIG. 3B, the photoresist film 30 is exposed, and as shown in FIG. 3C, the exposed substrate to be treated is subjected to post-exposure bake, and as shown in FIG. 3D, the substrate to be treated subjected to the post-exposure bake is developed, and furthermore, rinsed and dried, and thereby, the resist pattern 30a is formed.

On the other hand, FIG. 4 is a sectional view showing a comparative example (second comparative example) to the second specific example of the method for forming a resist pattern according to the first embodiment of this invention.

Figure 4A:
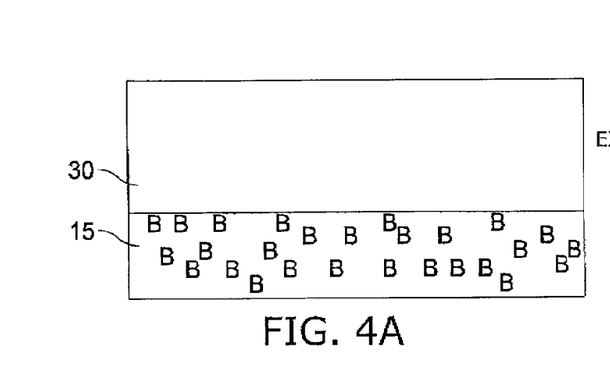
FIGS. 4A to 4D are sectional views showing a comparative example (second comparative example) to the second specific example of the method for forming a resist pattern according to the first embodiment of the invention.
Figure 4B:
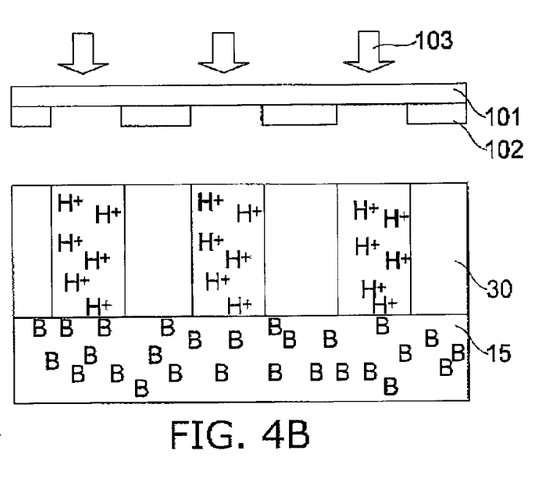
Figure 4C:
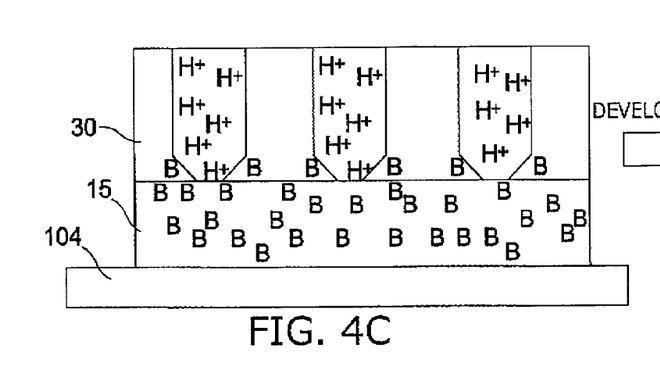
Figure 4D:
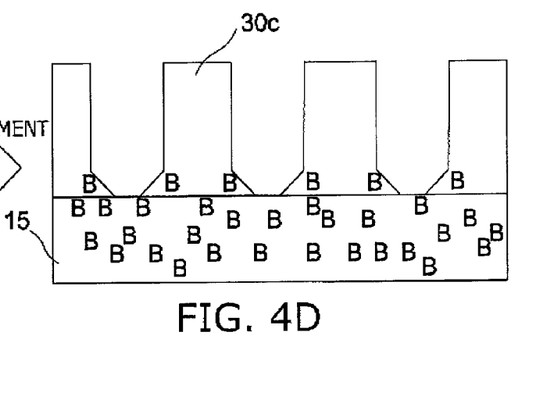

In this second comparative example, the chemical-amplification-type resist is directly applied onto the film to be processed 15 containing the base and the post-application bake is performed to form the photoresist film 30 (FIG. 4A), and then in the same method as the first specific example, the exposure (FIG. 4B) and the post-exposure bake (FIG. 4C) are performed, and furthermore, development, rinse, and dry are performed to form a resist pattern 30c (FIG. 4D).

In the second comparative example shown in FIG. 4, the base "B" in the film to be processed 15 diffuses into the photoresist in the post-exposure bake (PEB) (FIG. 4C), and inactivation of activity of the acid $H^+$ generated by the photoacid-generating-agent in the photoresist is caused, and therefore, the obtained resist pattern 30c has a shape with skirt generated in the root thereof (FIG. 4D).

By contrast, in the second specific example of this embodiment shown in FIG. 3, by the post-exposure bake (PEB), the base "B" in the film to be processed 15 diffuses into the buffering-agent-containing film 20, but binds to the acid $H^+$ contained in the buffering-agent-containing film 20 and dissociated from the organic acid $H^+ D^-$ to be $H^+ B^-$ and is trapped in the buffering-agent-containing film 20, and therefore, does not diffuse into the photoresist (FIG. 3C). Therefore, the inactivation of activity of the acid $H^+$ generated by the photoacid-generating agent in the photoresist is not caused, and about perpendicular resist pattern 30a having no skirt can be obtained (FIG. 3D).

As described above, according to the first embodiment, by providing the buffering-agent-containing film containing an acid and a salt of the acid immediately beneath the photoresist, a resist pattern having low dependency on the substrate to be treated can be obtained. Furthermore, in both of the cases that the film to be processed is acidic and that the film to be processed is basic, the common buffering-agent-containing film can be used, and therefore, it can be achieved to make the processes common.

Moreover, when the film to be processed is the porous film such as SOG film, if the photoresist film is directly formed thereon, the acid $H^+$ generated by the photoacid-generating agent in the photoresist comes to diffuse into the film to be processed. For preventing this, the acid is added to the film to be processed, but the control of the addition amount is difficult. By contrast, by providing the buffering-agent-containing film between the film to be processed and the photoresist film, the control of the addition amount of the acid in the film to be processed comes not to be required.

Second Embodiment

In a multilayer resist process (S-MAP: Stacked Mask Process) in which an intermediate film is formed on a lower layer film and a photoresist film is formed thereon as an upper layer film, the control of addition amount of the acid in the intermediate immediately beneath the photoresist film is difficult. In particular, when the porous film such as SOG film is used for the intermediate film, the acid is added to the intermediate film in order to balance diffusion and supply of the acid in the interface of the photoresist film and the intermediate film, but the control of the addition amount thereof is difficult.

Accordingly, in the second embodiment of the invention, the acid is added to the lower film and the balance of the diffusion and supply of the acid is controlled through the intermediate film. Because the intermediate film lies therebetween, compared to the case of addition to the intermediate film, the acid added to the lower layer film acts more dully, and therefore, the control of the addition amount of the acid is easier.

FIGS. 5A-6C are sectional views for explaining the method for forming a resist pattern according to a second embodiment of the invention. Also, for each of drawings after FIG. 5, the same signs are appended to the same components as explained with respect to a previous drawing, and the detailed explanation thereof will be omitted.

Figure 5A:
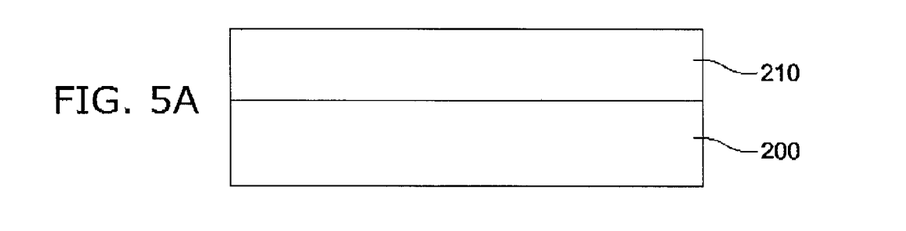
FIGS. 5A to 5C are sectional views for explaining a method for forming a resist pattern according to a second embodiment of the invention.

First, as shown in FIG. 5A, a lower layer film material to which a free acid or thermoacid-generating agent (TAG) or the photoacid-generating agent (PAG) or an agent in which two or more agents thereof are mixed is added is applied onto a substrate to be treated 200 and thereby stacked, and then, baked to form a lower layer film 210.

Here, as the specific example, on the silicon substrate, the organic lower layer film to which 5 wt % of TAG is added is spin-coated to have a film thickness of about 300 nm, and baked under the conditions of 180° C. for 60 seconds and 300° C. for 60 seconds. And, as the organic lower layer film, for example, novolak resin or cluster carbon is used, and 5 wt % of TAG is added to the solution thereof.

Moreover, as well as the application method, the lower layer film 210 can also be formed by CVD (Chemical Vapor Deposition) method or the like. Specifically, for example, by plasma-decomposing the mixed gas of a gas of hydrogenated carbon compound represented by $C_xH_y$ and a rare gas, a thin film composed of the lower layer film 210 and carbon can be deposited. Also in this case, it is sufficient to add a free acid or thermoacid-generating agent or the photoacid-generating agent or an agent in which two or more agents thereof are mixed.

Figure 5B:
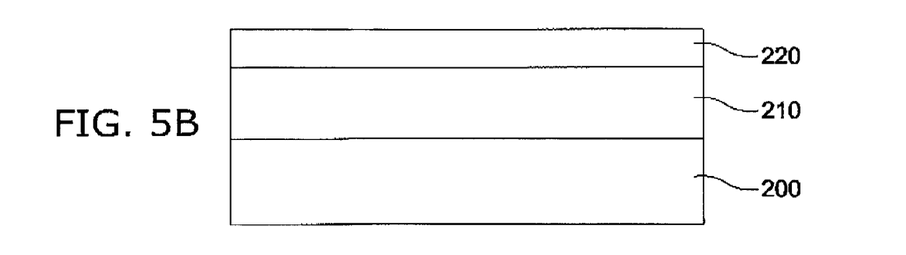

Next, as shown in FIG. 5B, an intermediate film material is applied onto the lower layer film 210, and this is baked to form an intermediate film 220.

Here, as the specific example, an inorganic intermediate film is spin-coated so that the film thickness thereof becomes 45 nm, and baked under the conditions of 180° C. for 60 seconds and 300° C. for 60 seconds. As the inorganic intermediate film, for example, there is used an SOG film to which acid is not added or of which addition amount of the acid is smaller than that of the case of controlling diffusion and supply of the acid in the photoresist film and the interface by the intermediate film.

When a film having high permeability such as SOG film is used as the intermediate film 220, the exposure light reaches the lower layer film 210, and therefore, it is also effective to use the lower film 210 to which PAG is added.

Figure 5C:
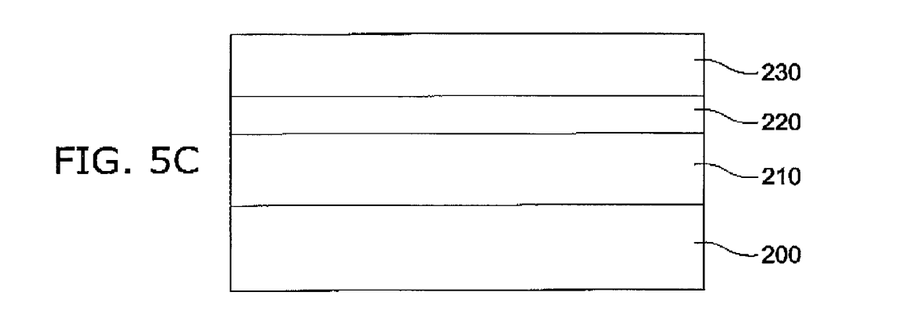

Next, as shown in FIG. 5C, the photoresist containing the photoacid-generating agent is applied onto the intermediate film 220 and this is subject to pre-exposure bake to form a photoresist film 230.

Here, as the specific example, the positive-type DUV resist film for ArF is spin-coated so that the film thickness thereof becomes 150 nm, and baked under the condition of 130° C. for 60 seconds.

Figure 6A:
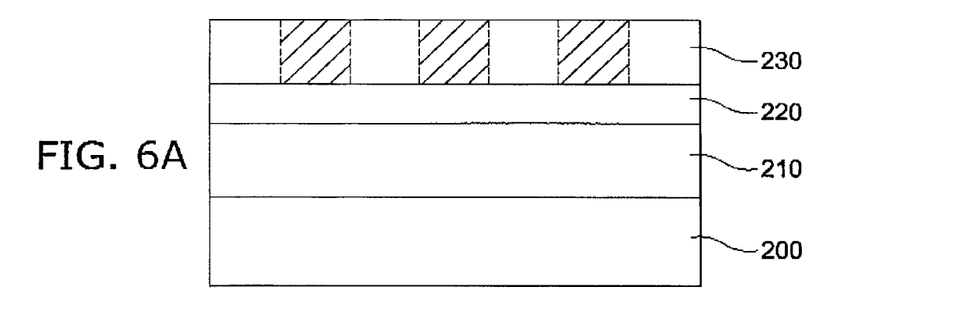
FIGS. 6A to 6C are sectional views for explaining a method for forming a resist pattern according to a second embodiment of the invention.

Next, as shown in FIG. 6A, the photoresist film 230 is selectively pattern-exposed, and this is subjected to post-exposure bake (PEB).

Here, as the specific example, the DUV resist film is pattern-exposed by ArF excimer laser exposure apparatus under the condition of NA=0.85, σ=0.90, and 3/4 orbicular zone illumination by using half tone exposure mask having 6% transmission so that the exposure amount is 28 mJ/cm². Furthermore, the post-exposure bake is performed under the condition of 130° C. for 90 seconds.

Figure 6B:
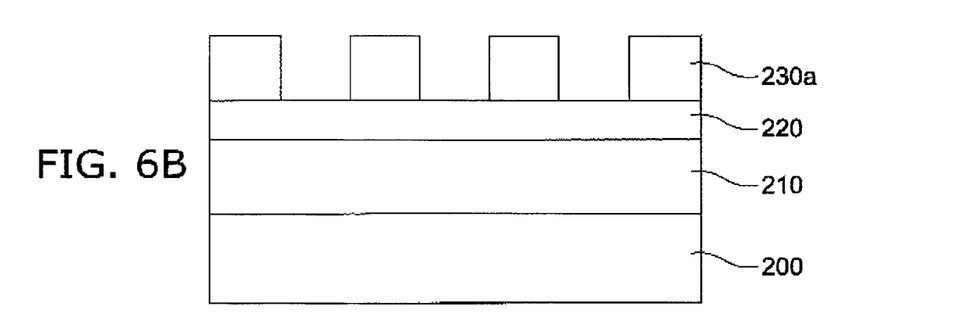

Next, as shown in FIG. 6B, the photoresist film 230 subjected to PEB is developed to form a resist pattern 230*a*.

Here, as the specific development process, puddle development using 2.38 wt % of tetramethyl ammonium hydroxide (TMAH) aqueous solution is performed for 30 seconds.

By the specific example described above, 0.07 μm or less of L/S (Line And Space) pattern was formed.

Figure 6C:
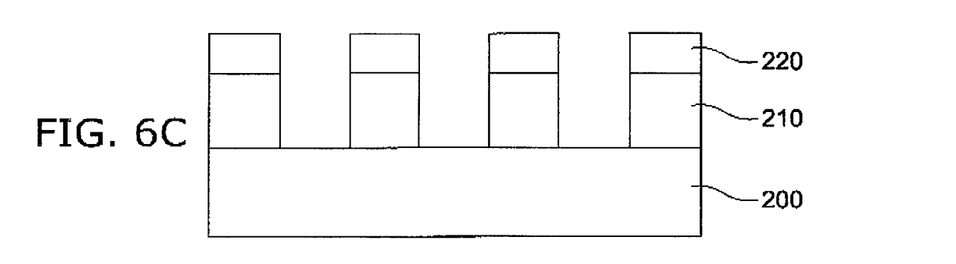

Next, as shown in FIG. 6C, the intermediate film 220 is patterned by reactive ion etching (RIE) so that the resist pattern 230*a* serves as an etching mask, and the lower layer film 210 is patterned (transcription processing) by RIE so that the patterned intermediated film 220 serves as an etching mask. In addition, then, the substrate to be treated 200 is etched so that the lower layer film 210 serves as an etching mask.

Figure 7A:
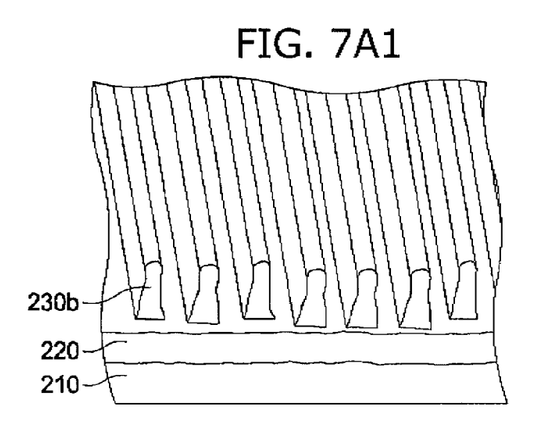
Figure 7A:
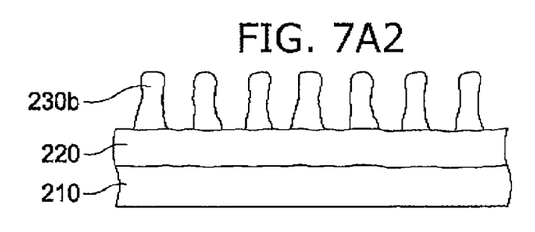
Figure 7B:
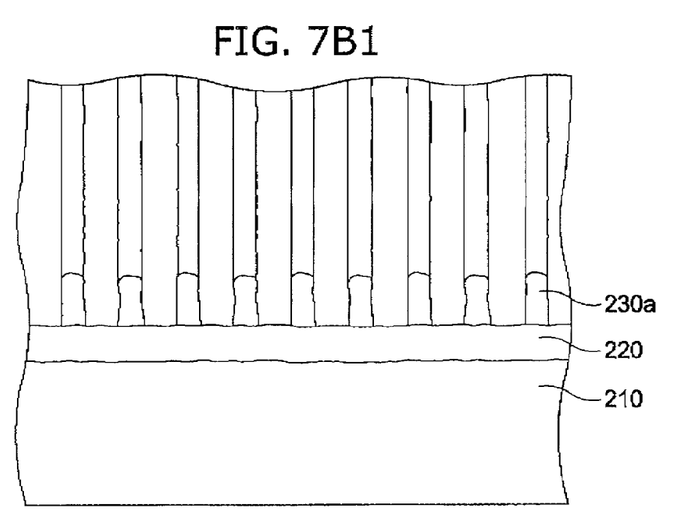
Figure 7B:
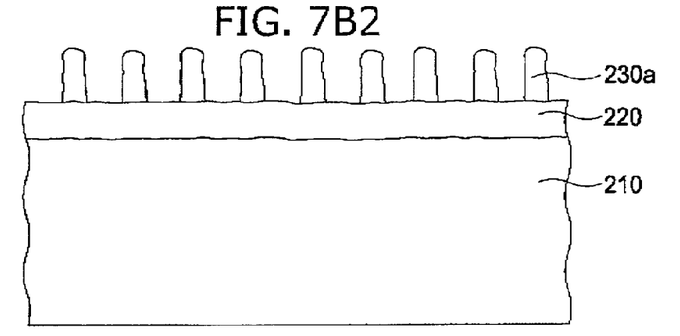

FIGS. 7A1-7B2 are diagrams showing sectional SEM photographs of resist pattern according to the specific example of the second embodiment of this invention with sectional SEM photographs of comparative example. And, FIGS. 7A1 and 7A2 show comparative example, and FIGS. 7B1 and 7B2 show specific example of this embodiment.

Figure 8A:
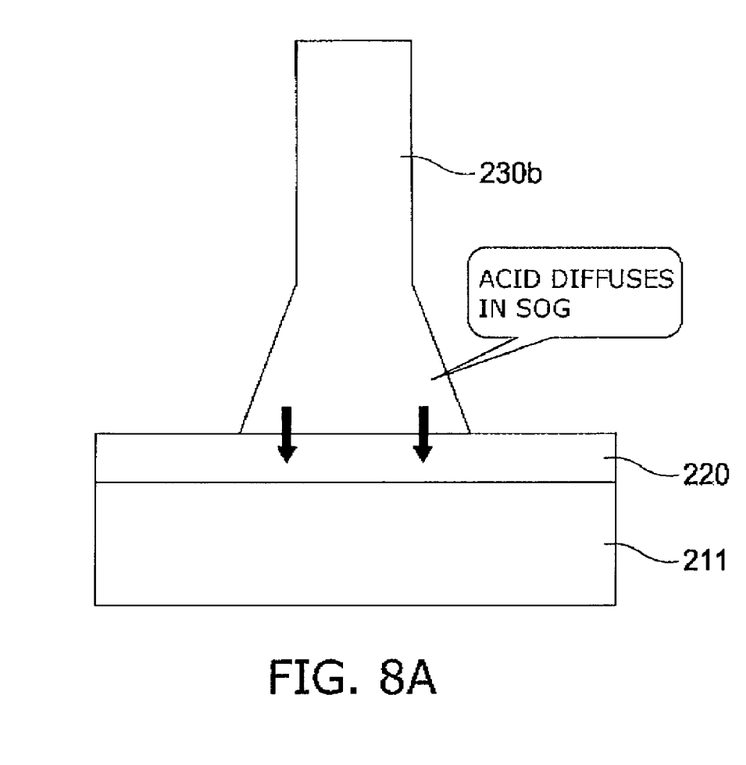
FIGS. 8A and 8B are schematic views showing a sectional shape of the resist pattern according to the specific example of the second embodiment of the invention with the comparative example.
Figure 8B:
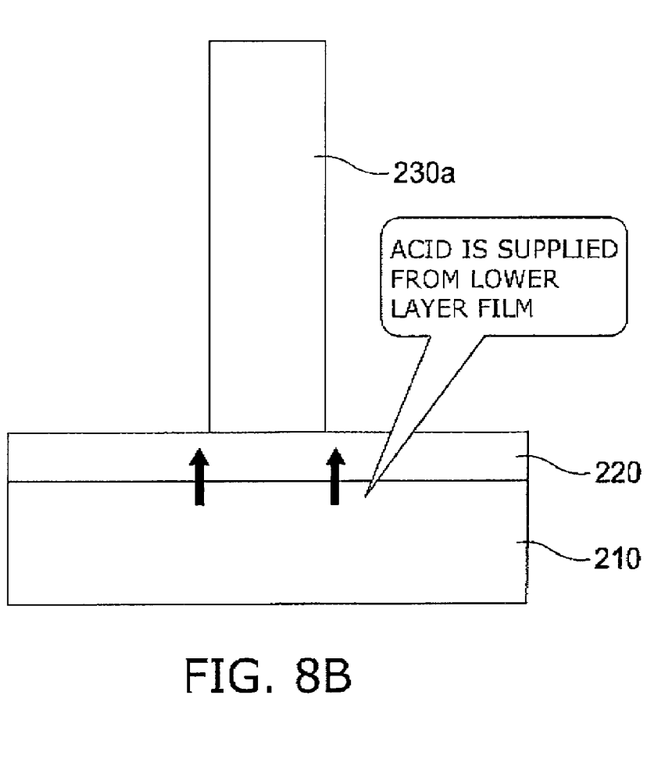

Moreover, FIGS. 8A and 8B are schematic views showing a sectional shape of the resist pattern according to the specific example of the second embodiment of this invention with the comparative example, and FIG. 8A shows Comparative example, and FIG. 8B shows the specific example of this embodiment.

In the comparative example, the lower layer film 210 composed of novolac resin to which 5 wt % of TAG is added in the specific example of this embodiment is set to be a lower layer film 211 composed of novolac resin to which neither of free acid, TAG, nor PAG is added. Moreover, both of the intermediate films 220 are SOG films.

Figure 9:
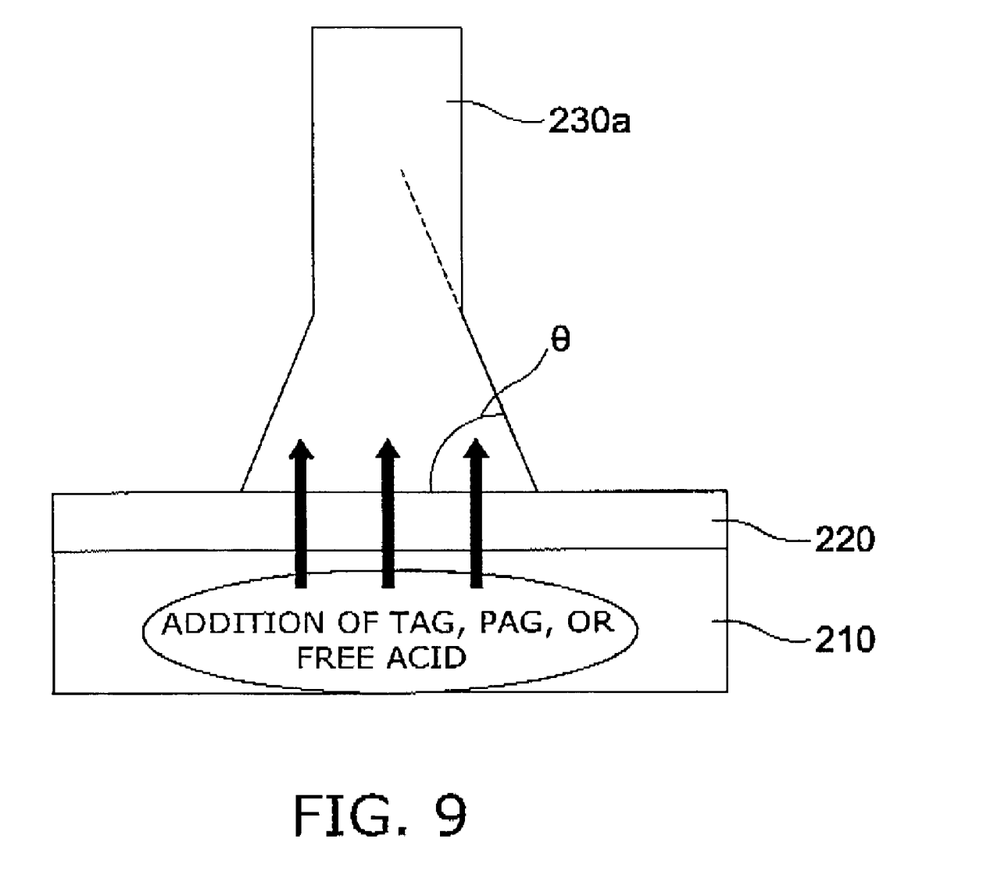
FIG. 9 is a schematic sectional view for explaining the definition of side-wall angle θ of the resist pattern and the control method of the side-wall angle θ by the second embodiment of the invention.

Moreover, FIG. 9 is a schematic sectional view for explaining the definition of side-wall angle θ of the resist pattern and the control method of the side-wall angle θ by the second embodiment of this invention.

In the resist pattern of the comparative example in which TAG or the like is not added to the lower layer film, the side-wall angle θ was 84° and the pattern had a skirt shape (FIGS. 7A1, 7A2, and 8A). By contrast, in the resist pattern of the specific example of this embodiment in which 5 wt % of TAG is added to the lower layer film, the side-wall angle θ was 89° and about perpendicular shape was obtained (FIGS. 7B1, 7B2, and 8B).

As shown in FIG. 8A, in the comparative example, even when the acid generated by the photo-sensing photoacid-generating agent in the photoresist diffuses into the intermediate film 220 composed of SOG by the post-exposure bake (PEB), the acid is not supplied from the lower layer film 211, and therefore, the inactivation of activity of the acid in the photoresist is caused. As a result, the obtained resist pattern 230*b* becomes a shape with skirt generated in the root thereof.

By contrast, as shown in FIG. 8B, in the specific example of this embodiment, the acid is supplied into the photoresist through the intermediate film 220 from the lower layer film 210 to which TAG is added, and therefore, diffusion and supply of the acid can be balanced. As a result, about perpendicular resist pattern 230*a* can be obtained.

As shown in FIG. 9, in this embodiment, by adjusting the addition amount of free acid, TAG, and PAG which are added to the lower layer film 210, the amount of the acids supplied to the interface of the photoresist through the intermediate film can be adjusted, and thereby, the side-wall angle θ of the resist pattern can be adjusted.

When the acid is added to the intermediate film such as SOG, the side-wall angle θ changes sensitively with respect to the change of the addition amount of the acids, and therefore, the resist pattern come to have high dependency on the substrate to be treated. However, in the lower layer film, because the change of the side-wall angle θ with respect to change of the addition amount of free acid, TAG, and PAG is dull, the control of the addition amount is easy. That is to say, the variation capacity of the addition amount with respect to the side-wall angle θ can be enlarged, and therefore, a resist pattern profile having low dependency on the substrate to be treated can be obtained. Thereby, production yield of the semiconductor device can be improved.

It is desirable to set the addition amount of free acid, TAG, and PAG of the lower layer film 210 so that the side-wall angle θ becomes 85°-90°.

After etching of the lower layer film (see, FIG. 6C), wafers of the specific example of this embodiment and the comparative example were subjected to defect inspection, and the number of short-type defects was about 150 in the organic lower layer film of the case of the comparative example, and by contrast, the number drastically lowered to be 20 or less in the organic lower layer film to which 5% of TAG was added of the specific example of this embodiment.

In the specific example of this embodiment, the bake temperatures of the lower layer film 210 and the intermediate film 220 are made to be the same, but the bake temperature of the intermediate film can be set to be higher than the bake temperature of the lower layer film. Thereby, the acid can be appropriately supplied from the intermediate film to the lower layer film. In particular, this is effective in the case of adding TAG or free acid.

According to the second embodiment, there is a merit that at least any one of free acid, TAG, and PAG is added not to the intermediate film immediately beneath the photoresist but to the lower layer film thereof and thereby, the resist pattern having lower dependency on the substrate to be treated can be obtained and therewith modification of the process is not required.

As described above, the embodiments of this invention have been explained with reference to drawings.

However, this invention is not limited to these embodiments, but the specific examples thereof can be appropriately modified in the range that is not departed from the spirit of this invention.

Moreover, by using the method for forming a resist pattern of this invention, wiring of the semiconductor device is formed or a gate of MOS transistor is formed, and thereby, various semiconductor devices can be produced.

Figure 10:
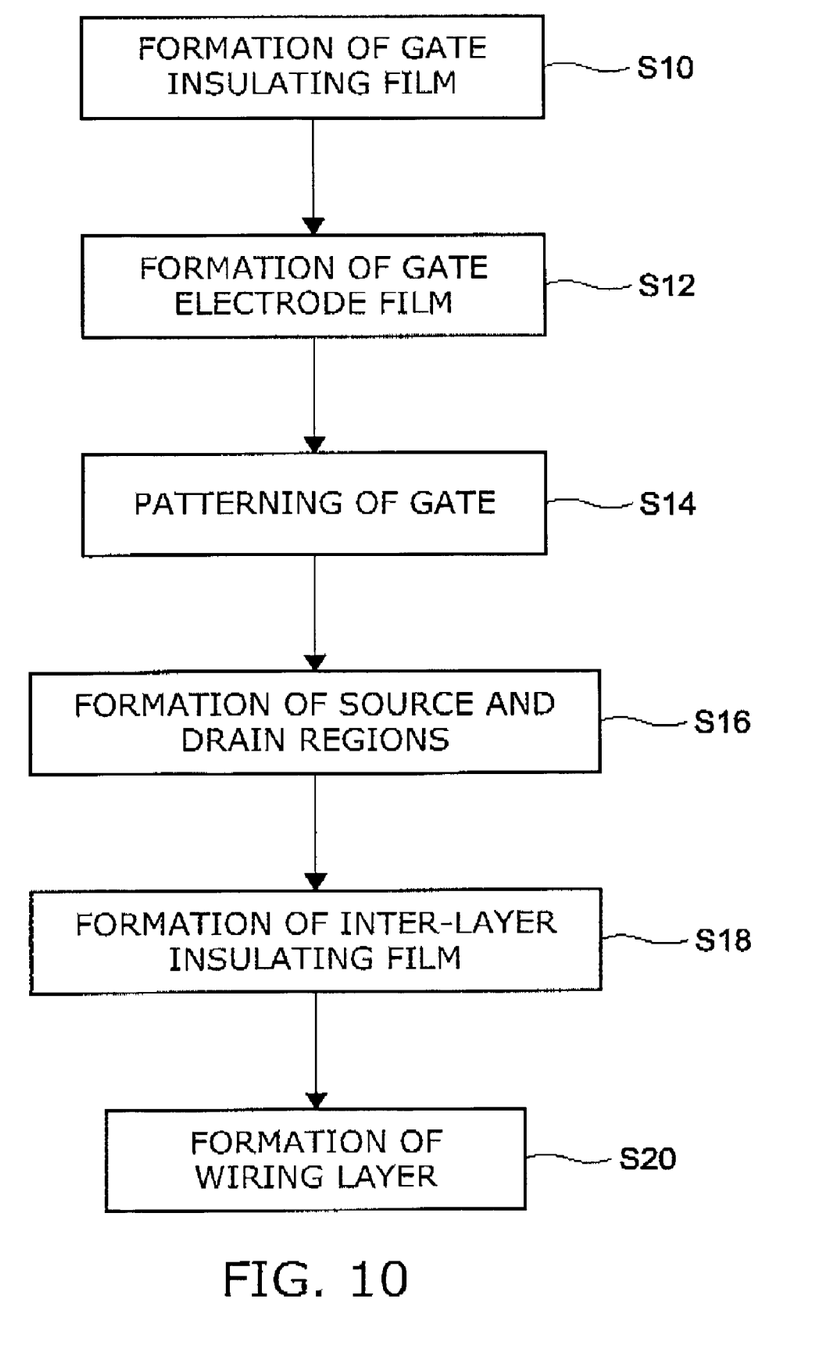
FIG. 10 is a flow chart illustrating a part of a production process of the semiconductor device.

FIG. 10 is a flow chart illustrating a part of a production process of the semiconductor device. That is, this figure illustrates a production process of a transistor.

In producing a transistor, first a gate insulator film is formed on a wafer such as silicon (Step S10). And, a conductive material to be a gate electrode is formed (Step S12). Then, a predetermined mask is formed and the gate electrode and the gate insulator film are patterned (Step S14). In the step of patterning, the method for forming a resist pattern of this embodiment can be used. That is, in patterning the gate electrode and the gate insulator film, the resist to be a mask is applied onto the gate electrode, and exposure is performed through a predetermined mask, and then, the resist is developed. In this case, by using the method for forming the resist pattern of this embodiment, the dependency on the substrate to be treated is low and the patterning can be smoothly carried out.

Then, by introducing impurities to the wafer so that the patterned gate serves as a mask, source and drain regions are formed (Step S16). And, an inter-layer insulator film is formed on the wafer (Step S18), and furthermore, a wiring layer is formed (Step S20), and thereby, a substantial part of the transistor is accomplished. Here, also in a step of forming a via-hole in the inter-layer insulator film or in a step of patterning a wiring layer, the method for forming a resist pattern of this embodiment can be used.

The invention claimed is:

1. A method for forming a resist pattern, comprising:
   forming a lower layer film containing at least any one of a free acid, a thermoacid-generating agents and a photo-acid-generating agent, on a substrate to be treated;
   forming an intermediate film on the lower layer film;
   forming a photoresist film containing a photoacid-generating agent on the intermediate film;
   exposing the photoresist film; and
   developing the photoresist film,
   wherein the lower layer is formed by plasma-decomposing a mixed gas of a gas of hydrogenated carbon compound and a rare gas.

2. The method according to claim 1, wherein the step of forming the lower layer film includes a step of stacking a material of the lower layer film and then baking the material at a first temperature, and the step of forming the intermediate film includes a step of stacking a material of the intermediate film and then baking the material at a second temperature higher than the first temperature.

3. The method according to claim 1, wherein the lower layer is formed by a spin-coating method or chemical vapor deposition method.

4. The method according to claim 1, wherein the lower layer is made of an organic material.

5. The method according to claim 1, wherein the intermediate film is formed by an inorganic material.

6. The method according to claim 1, wherein the intermediate film is a porous film.

7. The method according to claim 1, wherein the intermediate film is a spin-on-glass film to which acid is not added.

8. The method according to claim 1, wherein an addition amount of the one of the free acid, the thermoacid-generating agent, and the photoacid-generating agent free acid of the lower layer is set so that a side-wall angle .theta. of the developed photoresist film becomes 85°-90°.

* * * * *

UNITED STATES PATENT AND TRADEMARK OFFICE
CERTIFICATE OF CORRECTION

PATENT NO.         : 8,084,192 B2                               Page 1 of 1
APPLICATION NO.    : 12/260659
DATED              : December 27, 2011
INVENTOR(S)        : Sho et al.

It is certified that error appears in the above-identified patent and that said Letters Patent is hereby corrected as shown below:

Claim 1, column 9, line 15, change "agents" to --agent--.

Claim 8, column 10, line 21, change ".theta." to --θ--.

Signed and Sealed this
Third Day of April, 2012

David J. Kappos
*Director of the United States Patent and Trademark Office*